(12) United States Patent
Hwang et al.

(10) Patent No.: US 12,183,719 B2
(45) Date of Patent: Dec. 31, 2024

(54) DISPLAY TRANSFERRING STRUCTURE AND DISPLAY DEVICE INCLUDING THE SAME

(71) Applicant: SAMSUNG ELECTRONICS CO., LTD., Suwon-si (KR)

(72) Inventors: Junsik Hwang, Hwaseong-si (KR); Seogwoo Hong, Yongin-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 556 days.

(21) Appl. No.: 17/483,103

(22) Filed: Sep. 23, 2021

(65) Prior Publication Data

US 2022/0189931 A1 Jun. 16, 2022

Related U.S. Application Data

(60) Provisional application No. 63/125,597, filed on Dec. 15, 2020.

(30) Foreign Application Priority Data

Mar. 25, 2021 (KR) ..................... 10-2021-0038971

(51) Int. Cl.
*H01L 25/075* (2006.01)
*H01L 33/00* (2010.01)
(Continued)

(52) U.S. Cl.
CPC ........ *H01L 25/0753* (2013.01); *H01L 33/005* (2013.01); *H01L 33/20* (2013.01); *H01L 33/50* (2013.01); *H01L 33/62* (2013.01)

(58) Field of Classification Search
CPC ... H01L 25/0753; H01L 33/005; H01L 33/20; H01L 33/50; H01L 33/62; H01L 21/6835;
(Continued)

(56) References Cited

U.S. PATENT DOCUMENTS 5,545,291 A 8/1996 Smith et al.
6,606,079 B1 8/2003 Smith
(Continued)

FOREIGN PATENT DOCUMENTS

CN 110197814 A 9/2019
CN 111739877 A * 10/2020
(Continued)

OTHER PUBLICATIONS

Communication dated Mar. 23, 2022 issued by the European Patent Office in counterpart European Application No. 21199669.9.

*Primary Examiner* — Ratisha Mehta
*Assistant Examiner* — Brad A Knudson
(74) *Attorney, Agent, or Firm* — Sughrue Mion, PLLC

(57) ABSTRACT

A display transferring structure includes a transfer substrate including a plurality of recesses, each of the plurality of recesses including a first trap having a space in which a predetermined object can be moved and a second trap connected to the first trap and having a shape and size in which the object can be seated; and a micro-semiconductor chip positioned in the second trap. The micro-semiconductor chip may be self-aligned in a correct position by the display transferring structure.

24 Claims, 21 Drawing Sheets

(51) Int. Cl.
*H01L 33/20* (2010.01)
*H01L 33/50* (2010.01)
*H01L 33/62* (2010.01)

(58) Field of Classification Search
CPC ......... H01L 25/167; H01L 2221/68363; H01L 21/68
See application file for complete search history.

(56) References Cited

U.S. PATENT DOCUMENTS

| | | | |
|---|---|---|---|
| 7,125,736 | B2 | 10/2006 | Morita |
| 7,727,788 | B2 | 6/2010 | Han et al. |
| 7,774,929 | B2 | 8/2010 | Jacobs |
| 7,968,474 | B2 | 6/2011 | Martin et al. |
| 9,329,433 | B2 | 5/2016 | Negishi et al. |
| 9,913,371 | B2 | 3/2018 | Ray et al. |
| 10,032,957 | B2 | 7/2018 | Crowder et al. |
| 10,115,862 | B2 | 10/2018 | Zhan et al. |
| 10,418,527 | B2 | 9/2019 | Sasaki et al. |
| 10,644,190 | B2 | 5/2020 | Zhan et al. |
| 2007/0079571 | A1 | 4/2007 | Schatz |
| 2010/0167441 | A1 | 7/2010 | Ray et al. |
| 2017/0133550 | A1* | 5/2017 | Schuele ................ H01L 25/167 |
| 2017/0133558 | A1 | 5/2017 | Sasaki et al. |
| 2017/0317228 | A1 | 11/2017 | Sung |
| 2018/0138355 | A1* | 5/2018 | Zhan .................... H01L 33/04 |
| 2018/0145207 | A1* | 5/2018 | Heine ................ H01L 25/0753 |
| 2019/0006564 | A1 | 1/2019 | Sasaki et al. |
| 2019/0164946 | A1* | 5/2019 | Fu ........................ H01L 24/32 |
| 2020/0118931 | A1* | 4/2020 | Garner ................... H01L 24/25 |
| 2022/0051924 | A1 | 2/2022 | Kim et al. |
| 2022/0077120 | A1 | 3/2022 | Hong et al. |
| 2022/0102602 | A1 | 3/2022 | Hwang et al. |
| 2022/0115359 | A1 | 4/2022 | Kim et al. |
| 2022/0122953 | A1 | 4/2022 | Hwang et al. |
| 2022/0139887 | A1 | 5/2022 | Kim et al. |

FOREIGN PATENT DOCUMENTS

| | | | | |
|---|---|---|---|---|
| EP | 3352211 A1 * | 7/2018 | ....... | H01L 21/67017 |
| JP | 4352473 B2 | 10/2009 | | |
| KR | 10-2168570 B1 | 10/2020 | | |
| KR | 10-2022-0013739 A | 2/2022 | | |
| KR | 10-2022-0021325 A | 2/2022 | | |
| KR | 10-2022-0031364 A | 3/2022 | | |
| KR | 10-2022-0041484 A | 4/2022 | | |
| KR | 10-2022-0047131 A | 4/2022 | | |
| KR | 10-2022-0050674 A | 4/2022 | | |
| KR | 10-2022-0060977 A | 5/2022 | | |

\* cited by examiner

DISPLAY TRANSFERRING STRUCTURE AND DISPLAY DEVICE INCLUDING THE SAME

CROSS-REFERENCE TO RELATED APPLICATIONS

This application is based on and claims the benefit of U.S. Provisional Application No. 63/125,597, filed on Dec. 15, 2020, in the US Patent Office and is based on and claims priority to Korean Patent Application No. 10-2021-0038971, filed on Mar. 25, 2021, in the Korean Intellectual Property Office, the disclosures of which are incorporated herein in their entireties by reference.

BACKGROUND

1. Field

The disclosure relates to a display transferring structure and a display device including the same.

2. Description of the Related Art

Light emitting diodes (LEDs), which consume low power and are eco-friendly, have increased in industrial demand and have been applied as display pixels, as well as used as lighting devices and LCD backlights. In manufacturing display devices using micro-unit LED chips, a pick and place method has been used as a method of transferring micro LEDs. However, this method has low productivity as a size of micro LEDs decreases and a size of the displays increases.

SUMMARY

Provided are a display transferring structure in which a plurality of micro-semiconductor chips are efficiently positioned on a large substrate and a display device using the same.

Additional aspects will be set forth in part in the description which follows and, in part, will be apparent from the description, or may be learned by practice of the presented embodiments of the disclosure.

According to an aspect of the disclosure, there is provided a display transferring structure including: a transfer substrate including a plurality of recesses, each of the plurality of recesses including a first trap having a space in which an object is movable and a second trap connected to the first trap and having a shape and size in which the object is seatable; and a micro-semiconductor chip positioned in the second trap.

A size of the first trap may be set such that two or more micro-semiconductor chips cannot fit into each of the plurality of recesses A width of the second trap may be 105% or less of a width of the micro-semiconductor chip.

The second trap may overlap the first trap by a certain length.

The second trap may be circular, and a certain length by which the second trap overlaps the first trap may be greater than a radius of the second trap.

Each of the plurality of recesses may further include a third trap connected to the first trap or the second trap and having a size smaller than the second trap.

The first trap, the second trap, and the third trap may have a shape with symmetry, and the first trap, the second trap, and the third trap may be arranged such that centers of the symmetry thereof lies on a straight line.

The third trap may be include a plurality of third traps.

An outer surface of the transfer substrate and an inner surface of each of the plurality of recesses may be surface-treated to have different properties.

A metal coating layer may be formed on an outer surface of the transfer substrate.

The display transferring structure may further include a driving circuit configured to drive the micro-semiconductor chip.

The driving circuit may be located in the transfer substrate.

The display transferring structure may further include a circuit board located under the transfer substrate and including the driving circuit.

According to another aspect of the disclosure, there is provided a display device including: a transfer substrate including a plurality of recesses, a region of each of the plurality of recesses including comprising a first trap having a space in which a predetermined an object is movable can be moved and a second trap connected to the first trap and having a shape and size in which the object is seatable can be seated; a micro-semiconductor chip positioned in the second trap; a driving circuit configured to drive the micro-semiconductor chip; and a color conversion layer positioned on the transfer substrate.

The driving circuit may be located in the transfer substrate.

The display device may further include: a circuit board located under the transfer substrate and including the driving circuit.

A size of the first trap may be set such that two or more micro-semiconductor chips cannot fit in each of the plurality of recesses.

A width of the second trap may be 105% or less of a width of the micro-semiconductor chip.

The second trap may overlap the first trap by a certain length.

The first trap and the second trap may be circular, and the certain length by which the second trap overlaps the first trap may be greater than a radius of the second trap.

Each of the plurality of recesses may further include a third trap connected to the first trap or the second trap and having a size smaller than the second trap.

The first trap, the second trap, and the third trap have a shape with symmetry, and the first trap, the second trap, and the third trap may be arranged such that centers of the symmetry thereof lies on a straight line.

According to another aspect of the disclosure, there is provided an electronic device including any one display device described above is provided.

According to another aspect of the disclosure, there is provided a display transferring structure including: a transfer substrate including a plurality of recesses, each of the recesses including: a first region configured to receive a semiconductor chip in a movable state, a second region connected to the first region, and configured to receive the semiconductor chip in a secured manner; and a third region connected to the second region, and having a size smaller than the second region.

According to another aspect of the disclosure, there is provided a method of manufacturing a semiconductor chip transferring structure including: supplying a liquid to a plurality of plurality of recesses, each of the recesses including a first region and a second region connected to the first region and having a size smaller than the first region;

providing a plurality of semiconductor chips on the semiconductor chip transferring structure; scanning an absorber over the plurality of recesses in a first direction to move a semiconductor chip, among the plurality of semiconductor chips, into the first region of a first recess, among the plurality of recesses; and scanning the absorber in a second direction different from the first direction to move the semiconductor chip into the second region of the first recess.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
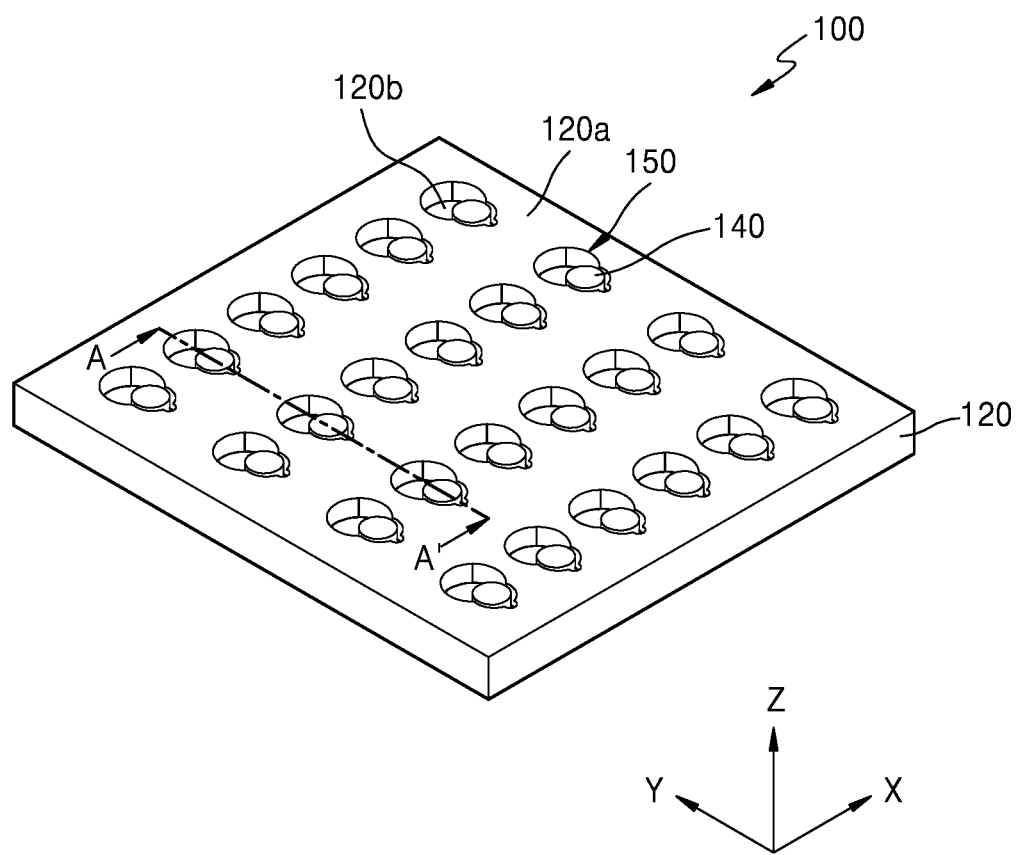
FIG. 1 is a perspective view illustrating a schematic structure of a display transferring structure according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of" when preceding a list of elements, modify the entire list of elements and do not modify the individual elements of the list.

Hereinafter, example embodiments will be described in detail with reference to the accompanying drawings. The described embodiments are merely examples, and various modifications may be made from these embodiments. Like reference numerals in the drawings denote like elements, and, in the drawings, the sizes of elements may be exaggerated for clarity and for convenience of explanation.

Hereinafter, when it is described that a certain component is "above" or "on" another component, the certain component may be directly above another component, or a third component may be interposed therebetween.

Although terms, such as 'first' and 'second', may be used to describe various elements, the elements cannot be limited by the terms. The terms may be used to classify a certain element from another exemplary element. These terms are not intended to limit differences in materials or structures of components.

An expression in the singular includes an expression in the plural unless they are clearly different from each other in context. In addition, when a certain part "includes" a certain component, this indicates that the part may further include another component instead of excluding another component unless there is different disclosure.

In addition, the term, such as "unit" or "module," disclosed in the specification indicates a unit for processing at least one function or operation, and this may be implemented by hardware, software, or a combination thereof.

The use of the term "the" and similar referential terms may refer to both the singular and the plural.

The steps constituting a method may be performed in any suitable order unless there is a clear statement that the steps in the method should be performed in the order described. In addition, the use of all exemplary terms (e.g., etc.) is merely for describing technical ideas in detail, and the scope of the present disclosure is not limited by these terms unless limited by claims.

Figure 2:
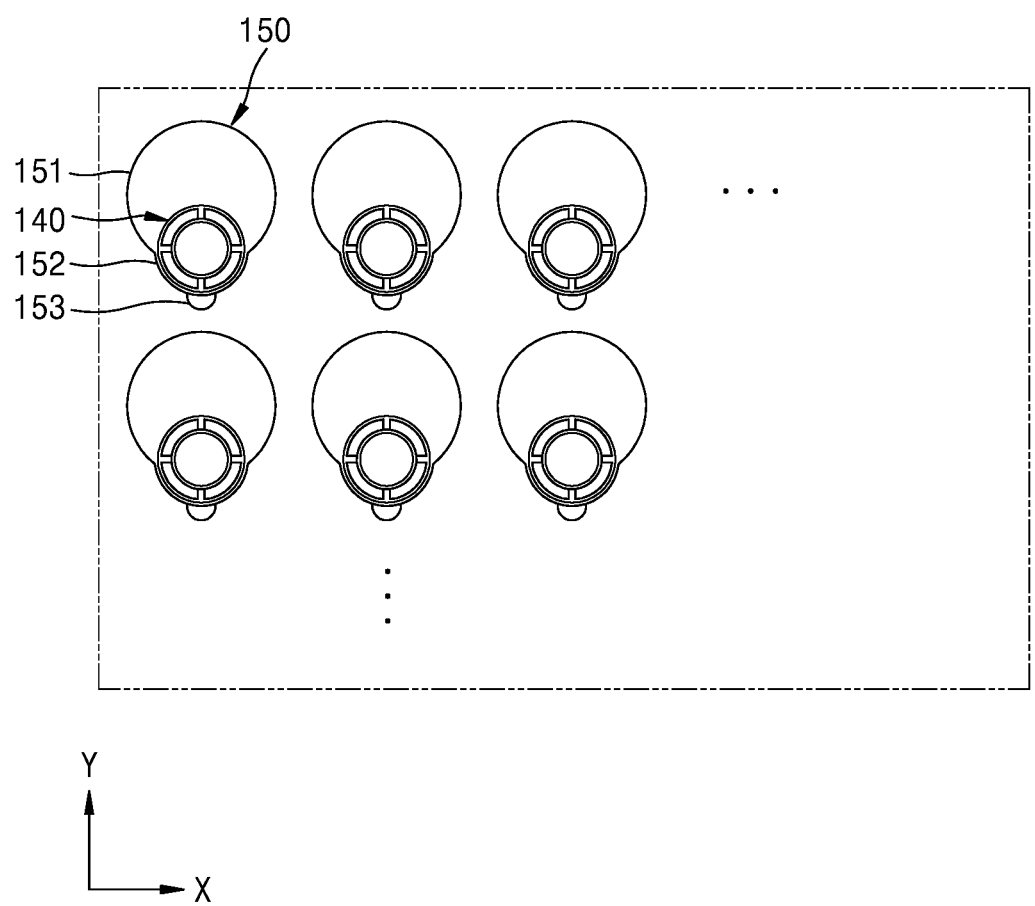
FIG. 2 is an enlarged plan view of a partial region of FIG. 1.
Figure 3:
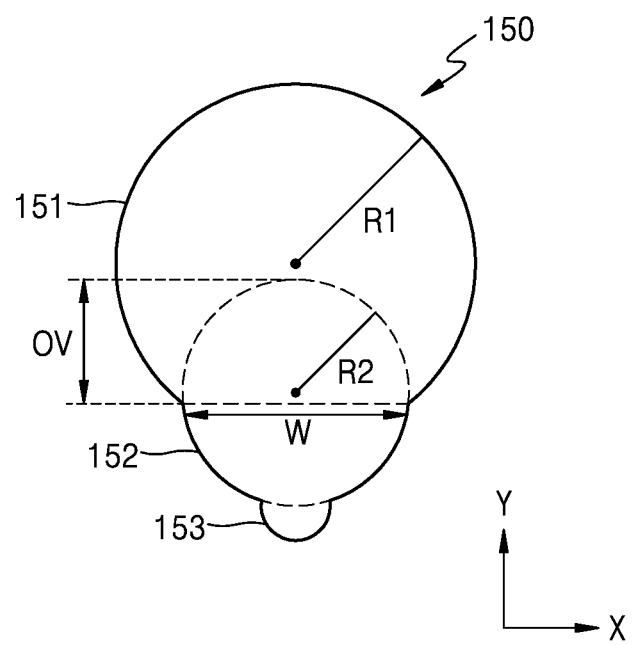
FIG. 3 is a plan view illustrating a shape of a recess provided in a transfer substrate of the display transferring structure of FIG. 1.

FIG. 1 is a perspective view illustrating a schematic structure of a display transferring structure 100 according to an example embodiment, FIG. 2 is an enlarged plan view of a partial region of FIG. 1, and FIG. 3 is a plan view illustrating a shape of a recess 150 provided in a transfer substrate 120 of the display transferring structure 100 of FIG. 1.

The display transferring structure 100 includes the transfer substrate 120 having a plurality of recesses 150. According to an example embodiment, the transfer substrate may have a micro-semiconductor chip 140 in each of the recesses 150. As shown in FIGS. 1 and 2, the micro-semiconductor chip 140 is arranged in a certain position in each of the recesses 150 with little or no position error.

The micro-semiconductor chip 140 may include various types of semiconductor chips having a micro size, and the micro size may be 1000 μm or less, 200 μm or less, 100 μm or less, or 50 μm or less. The micro-semiconductor chip 140 may include, for example, a light emitting diode (LED), a complementary metal-oxide semiconductor (CMOS), a CMOS image sensor (CIS), a vertical-cavity surface-emitting laser (VCSEL), a photodiode (PD), a memory device, a two-dimensional (2D) material device, and the like. A 2D material may include graphene or carbon nano-tubes (CNT).

In the following description, the micro-semiconductor chip 140 may be described as an LED chip, but is not limited thereto.

The transfer substrate 120 for arranging the micro-semiconductor chips 140 in a fluid self-alignment (FSA) manner includes the recesses 150 for aligning the micro-semiconductor chips 140.

As shown in FIGS. 2 and 3, each region of the recesses 150 includes a first trap 151 having a space in which a certain object may move, and a second trap 152 connected to the first trap 151 and having a shape and a size in which the object may be seated. In addition, each region of the plurality of recesses 150 may further include a third trap 153 connected to the second trap 152 and having a size smaller than the second trap 152. The third trap 153 may serve as an impurity space. When the micro-semiconductor chip 140 is aligned in the second trap 152 in a fluid manner, impurities that may be in a suspension including the micro-semiconductor chip 140 may be induced to the third trap 153, and thus, the micro-semiconductor chip 140 may be properly aligned in the second trap 152. The third trap 153 is smaller in size than the second trap 152 and is not limited in shape. The third trap 153 may be provided in plurality or may be omitted. In the following embodiments, the recess 150 is illustrated as including the first trap 151, the second trap 152, and the third trap 153, but is not limited thereto, and the recess 150 may include only the first trap 151 and the second trap 152. Although elements 151, 152 and 153 are referred to as traps, according to another example embodiment, elements 151, 152 and 153 may be referred to as regions (i.e., a first region, a second region or a third region) or portions (i.e., a first portion, a second portion or a third portion).

The first trap 151 is set to a size corresponding to a space in which the micro-semiconductor chip 140 may move. That is, the size of the first trap 151 is such that the micro-semiconductor chip 140 is movable within a region inside the first trap 151. In addition, a size of the first trap 151 may have a size such that one micro-semiconductor chip 140 is in one recess 150. In other words, the size of the first trap 151 may be set such that two or more micro-semiconductor chips 140 cannot fit into the recess 150. As shown in FIG. 3, the first trap 151 may partially overlap the second trap 152 having a circular radius R2, and the first trap 151 may have a circular shape of radius R1 of which a portion is cut off. The circular radius R2 of the second trap 152 may be set such that an arbitrary width of a region of the second trap 151 except for a portion thereof overlapping the first trap 152 is less than a width of the micro-semiconductor chip 140.

The second trap 152 has a shape and size corresponding to the micro-semiconductor chip 140. In other words, the second trap 152 has a shape and size in which the micro-semiconductor chip 140 may be seated. According to an example embodiment, the second trap 152 has a shape and size in which the micro-semiconductor chip 140 may be fixedly positioned such that the micro-semiconductor chip 140 is not movable within a region inside the second trap 152. For instance, at least a portion of the second trap 152 has a shape and size conforming to (or matching) a shape and size of the micro-semiconductor chip 140. As such, at least a portion of the micro-semiconductor chip 140 may be seated inside the second trap 152 in a secured or snug manner. When the micro-semiconductor chip 140 is circular, the second trap 152 may also be circular, or may have a shape such as an ellipse or a polygon in which a circular micro-semiconductor chip 140 may fit. When the micro-semiconductor chip 140 has a quadrangular shape, the second trap 152 may also have a quadrangular shape, or may have a circular, an elliptical, or other polygonal shape in which a quadrangular-shaped micro-semiconductor chip 140 may fit.

As shown in FIG. 3, the first trap 151 may overlap the second trap 152 by a certain length. An overlap length OV is a length of a region in which the first trap 151 overlaps the second trap 152 in a direction (Y direction) in which the first and second traps 151 and 152 are arranged. When the second trap 152 is circular, the length OV at which the second trap 152 overlaps the first trap 151 is greater than the radius R2 of the second trap 152. Accordingly, a width W of one end of the first trap 151, which is an outlet of the first trap 151, may be secured within a certain range, and the micro-semiconductor chip 140 may move from the first trap 151 toward the second trap 152 and may then be seated in the second trap 152.

The second trap 152 has a size in which the micro-semiconductor chip 140 may be seated, and may have substantially the same size as the micro-semiconductor chip 140. For example, the width of the second trap 152 may be 100% or more, 105% or less, 103% or less, or 101% or less of the width of the micro-semiconductor chip 140.

The first trap 151, the second trap 152, and the third trap 153 may have a shape with symmetry, and the first trap 151, the second trap 152, and the third trap 153 may be positioned such that centers of the symmetry thereof are placed on a straight line.

Referring to FIG. 1, in order for the micro-semiconductor chips 140 to be self-aligned in the recesses 150 in a fluid manner, respectively, an outer surface 120a of the transfer substrate 120 and an inner bottom surface 120b of the recess 150 may be surface-treated to have the different properties. The outer surface 120a of the transfer substrate 120 may be surface-treated to be hydrophobic, and the inner bottom surface 120b of the recess 150 may be surface-treated to be hydrophilic.

Figure 4:
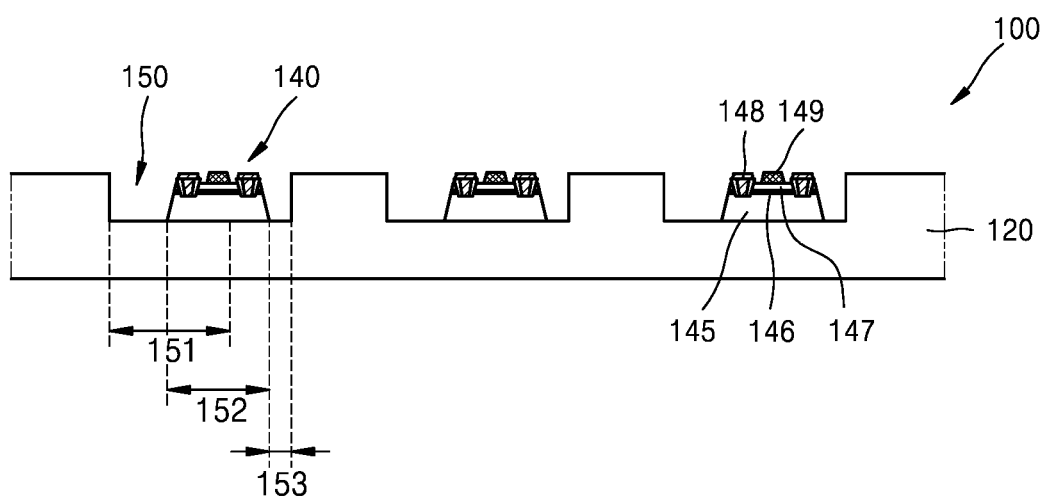
FIG. 4 is a cross-sectional view of a partial region of FIG. 1 along A-A'.

FIG. 4 is a cross-sectional view of a partial region of FIG. 1 along A-A'.

The micro-semiconductor chip 140 is in the second trap 152 in each of the recesses 150 formed in the transfer substrate 120.

Referring to an exemplary structure of the micro-semiconductor chip 140, the micro-semiconductor chip 140 may include an n-type semiconductor layer 145, an active layer 146, and a p-type semiconductor layer 147. The n-type semiconductor layer 145 may include n-type GaN, and the p-type semiconductor layer 147 may include p-type GaN, but the n-type semiconductor layer 145 and the p-type semiconductor layer 147 are not limited thereto. The active layer 146 may have, for example, a quantum well structure or a multi-quantum well structure. A first electrode 148 and a second electrode 149 are in an upper portion of the micro-semiconductor chip 140. The first electrode 148 is electrically connected to the n-type semiconductor layer 145, and the second electrode 149 is electrically connected to the p-type semiconductor layer 147. A shape of the micro-semiconductor chip 140 is an example and is not limited thereto.

Figure 5:
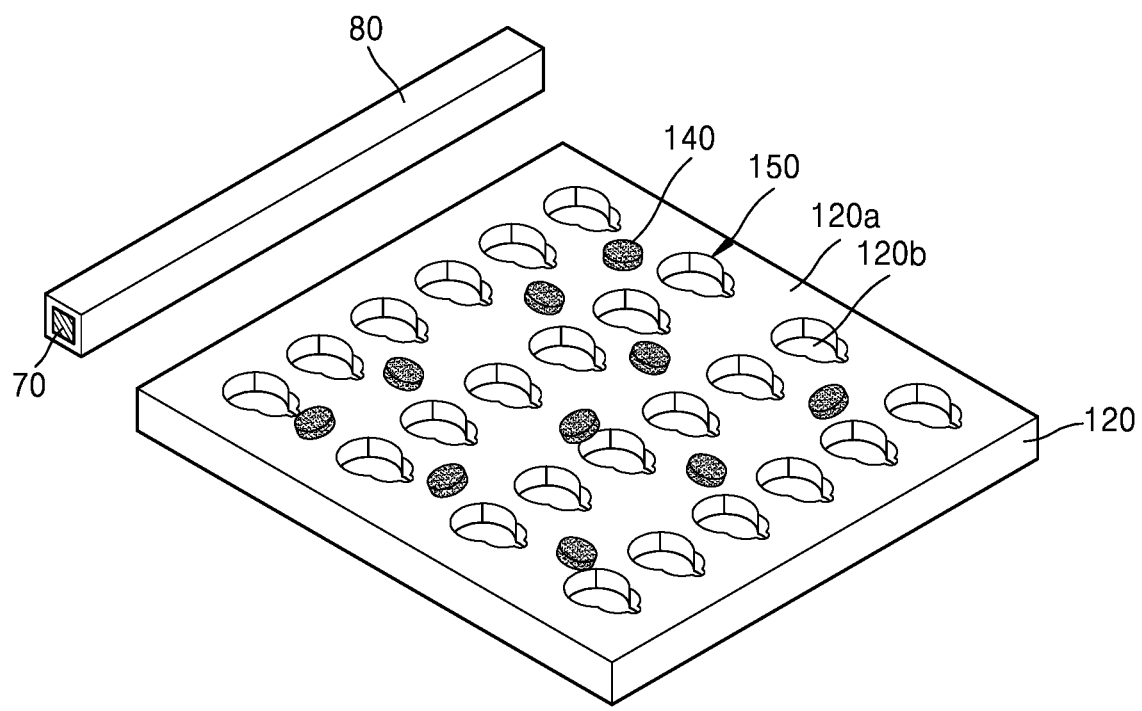
FIG. 5 is a view illustrating a process of forming the display transferring structure of FIG. 1 according to an example embodiment.

FIG. 5 is a diagram schematically illustrating a process of forming the display transferring structure 100 of FIG. 1, and FIGS. 6A to 6C are enlarged views of partial regions of FIG. 5, illustrating a process in which the micro-semiconductor chip 140 is self-aligned in a certain position in the recess of the transfer substrate 120.

FIG. 5 shows a state in which the micro-semiconductor chips 140 are supplied on the transfer substrate 120 having the recess 150 having the shape described above. The micro-semiconductor chips 140 may be sprayed directly on the transfer substrate 120 after a certain liquid is supplied to the recesses 150 of the transfer substrate 120, or may be included in a certain suspension and supplied to the transfer substrate 120.

The liquid supplied to the recess 150 may be any type of liquid as long as the liquid does not corrode or damage the micro-semiconductor chip 140, and various methods such as a spray method, a dispensing method, an inkjet dot method, and a method of transferring a liquid to the substrate 120 may be used. The liquid may include, for example, one selected from the group consisting of water, ethanol, alcohol, polyol, ketone, halocarbon, acetone, flux, and an organic solvent, or any combination thereof. The organic solvent may include, for example, isopropyl alcohol (IPA).

The micro-semiconductor chips 140 may be directly sprayed onto the transfer substrate 120 without any other liquid, or may be included in a suspension and supplied onto the transfer substrate 120. As a method of supplying the micro-semiconductor chip 140 included in the suspension, various methods such as a spray method, a dispensing method of dropping a liquid in drops, an inkjet dot method of discharging a liquid like a printing method, and a method of applying a suspension onto the transfer substrate 120 may be used.

An absorber 80 may scan the transfer substrate 120. According to scanning, the absorber 80, while passing on the recesses 150, in contact with the transfer substrate 120, may move the micro-semiconductor chip 140 into the recess 150 and may absorb a liquid present in the recess 150. The absorber 80 may be any material as long as the material is capable of absorbing a liquid, and is not limited in shape or structure. The absorber 80 may include, for example, fabric, tissue, polyester fiber, paper, or wiper. The absorber 80 may be used alone without other auxiliary devices, but is not limited thereto, and may be coupled to a support 70 to facilitate scanning the transfer substrate 120. The support 70 may have various shapes and structures suitable for scanning the transfer substrate 120. The support 70 may have a shape such as, for example, a rod, a blade, a plate, or a wiper. The absorber 80 may be provided on any one side of the support 70 or may wrap around the support 70. The shape of the support 70 and the absorber 80 is not limited to the illustrated quadrangular cross-sectional shape, and may be a circular cross-sectional shape.

The absorber 80 may scan the transfer substrate 120, while pressing the transfer substrate 120 with an appropriate pressure. Scanning may be performed according to various methods, for example, a sliding method, a rotating method, a translation method, a reciprocating method, a rolling method, a spinning method, and/or a rubbing method of the absorber 80, which may include both a regular method or an irregular method. Scanning may be performed by moving the transfer substrate 120 instead of moving the absorber 80, and scanning of the transfer substrate 120 may also be performed in a manner such as sliding, rotation, translational reciprocation, rolling, spinning, and/or rubbing. Scanning may also be performed by cooperation between the absorber 80 and the transfer substrate 120.

Figure 6A:
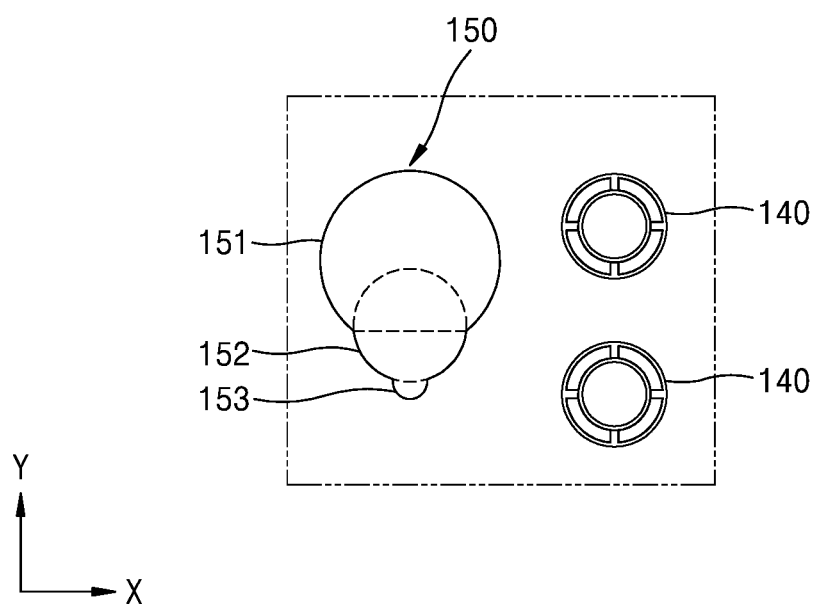
FIGS. 6A to 6C illustrate a process of self-aligning a micro-semiconductor chip in a determined position of a recess of a transfer substrate shown in FIG. 5.
Figure 6B:
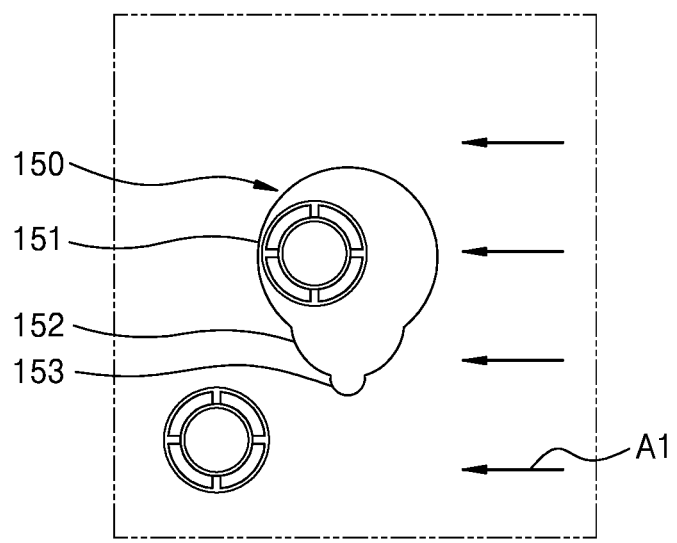
Figure 6C:
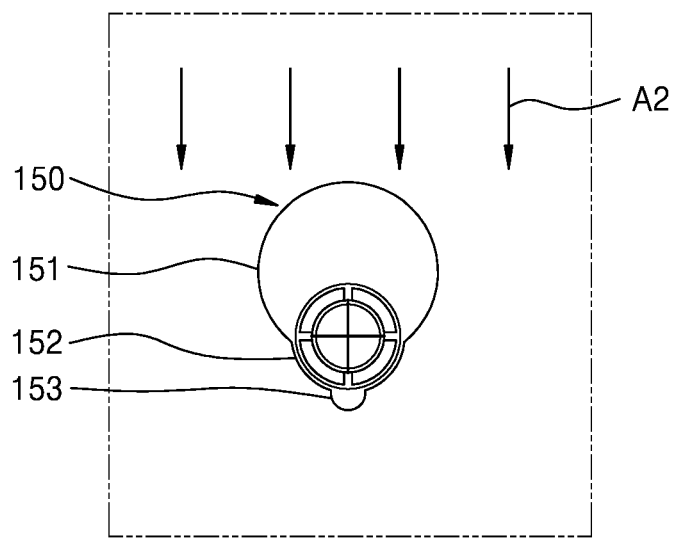

One of two micro-semiconductor chips 140 adjacent to the recess 150, as shown in FIG. 6A, enters the first trap 151 of the recess 150 according to scanning in a direction A1, as shown in FIG. 6B. The first trap 151 has a space in which one micro-semiconductor chip 140 may move according to fluid flow, and a position of the micro-semiconductor chip 140 in the first trap 151 is not fixed. Next, as shown in FIG. 6C, the micro-semiconductor chip 140 moves to the second trap 152, which has a narrower width than the first trap 151 and is a space in which the micro-semiconductor chip 140 is aligned according to scanning in a direction A2.

After the absorber 80 scans the transfer substrate 120, a dummy micro-semiconductor chip remaining on the transfer substrate 120 without entering the recess 150 is removed. After the micro-semiconductor chip 140 is seated on the second trap 152, the seated micro-semiconductor chip 140 may be pre-bonded to the transfer substrate 120 using, for example, a pre-bonder.

In the above description, the micro-semiconductor chip 140 has a circular cross-section, and the first trap 151, the second trap 152, and the third trap 153 have a circular-based shape, but these shapes may be changed to be different.

FIGS. 7A to 7E illustrate examples of recesses of various shapes that may be employed in the display transferring structure of FIG. 1 and micro-semiconductor chips positioned in correct positions in the recesses.

Figure 7A:
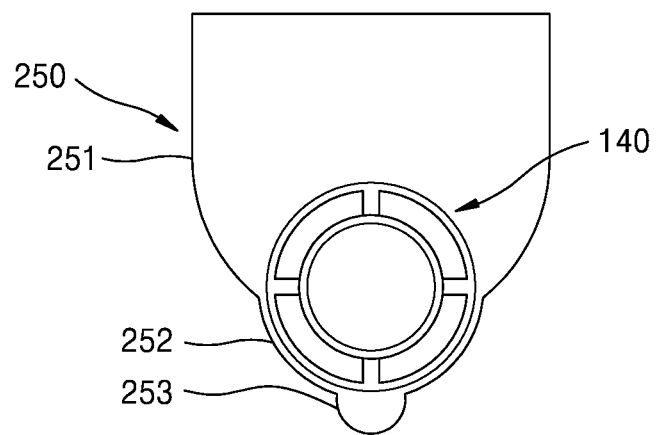
FIGS. 7A to 7E illustrate examples of recesses having various shapes that may be employed in the display transferring structure of FIG. 1 and micro-semiconductor chips positioned in correct positions in the recesses.

According to an example embodiment illustrated in FIG. 7A, a recess 250 may include a first trap 251, a second trap 252, and a third trap 253. The second trap 252 is circular, and the first trap 251 has a shape in which one end of the first trap 151 shown in FIG. 3 is deformed into a rectangular shape.

Figure 7B:
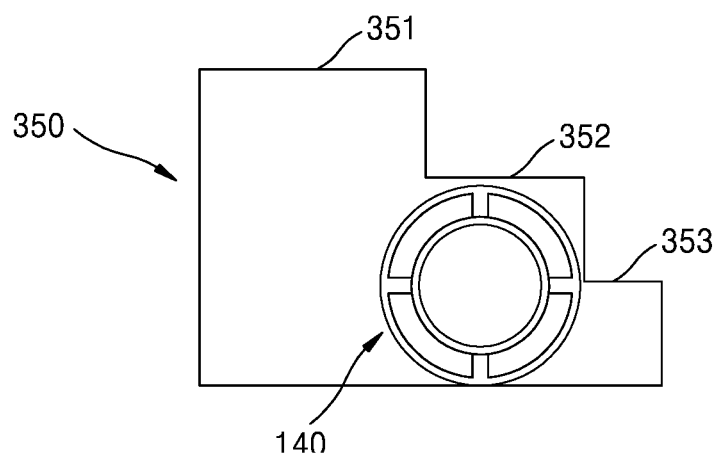

According to an example embodiment illustrated in FIG. 7B, a recess 350 may include a first trap 351, a second trap 352, and a third trap 353. The first trap 351, the second trap 352, and the third trap 353 of the recess 350 may have a quadrangular shape, and a circular micro-semiconductor chip 140 may be positioned in the second trap 352.

Figure 7C:
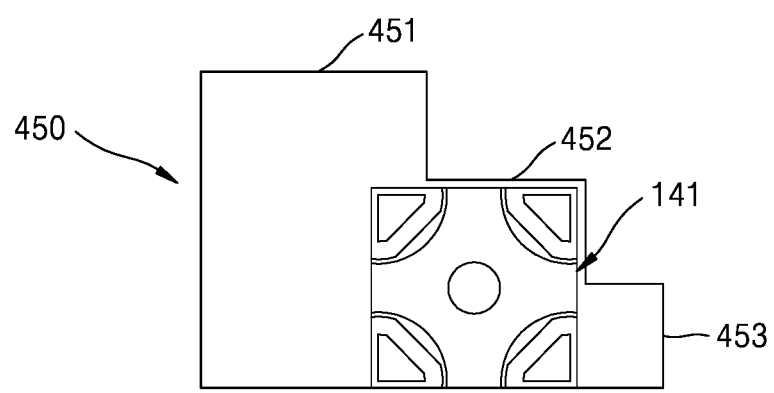

According to an example embodiment illustrated in FIG. 7C, a first trap 451, a second trap 452, and a third trap 453 of a recess 450 may have a quadrangular shape, and a quadrangular micro-semiconductor chip 141 may be positioned in the second trap 452.

Figure 7D:
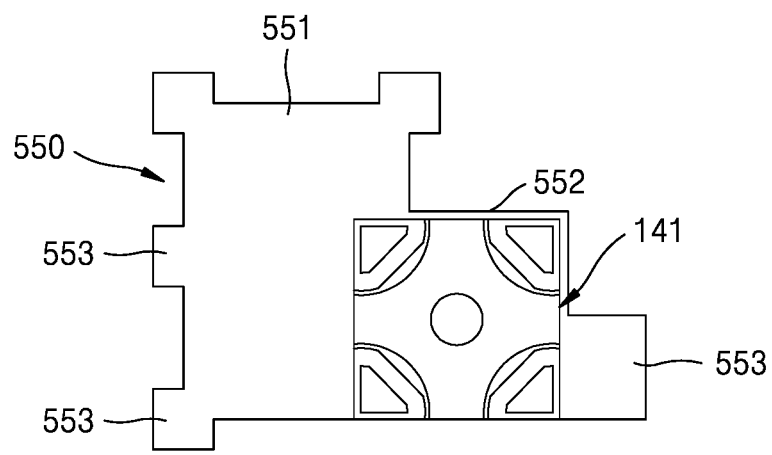

According to an example embodiment illustrated in FIG. 7D, a first trap 551, a second trap 552, and a third trap 553 of a recess 550 may have a quadrangular shape, and the third trap 553 may be provided in plurality. Some of the plurality of third traps 553 may have different sizes.

Figure 7E:
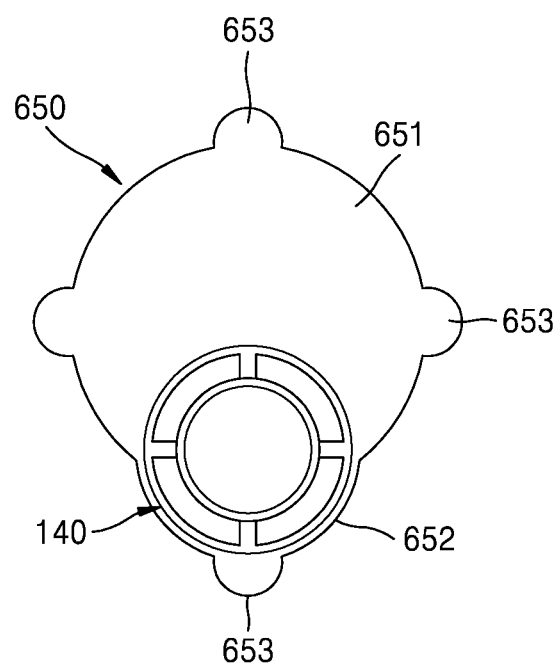

According to an example embodiment illustrated in FIG. 7E, a first trap 651, a second trap 652, and a third trap 653 of a recess 650 may have a quadrangular shape, and the third trap 653 may be provided in plurality. The plurality of third traps 653 are all illustrated to have the same size, but are not limited thereto, and some of the third traps 653 may have different sizes.

Figure 8:
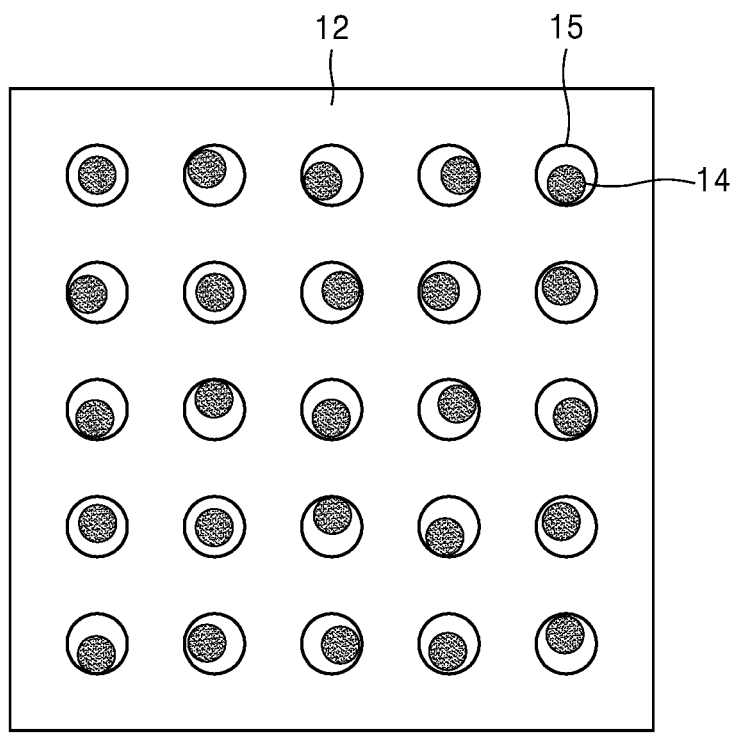
FIG. 8 is a cross-sectional view illustrating an arrangement of micro-semiconductor chips in a display transferring structure according to a comparative example.

FIG. 8 is a cross-sectional view illustrating an arrangement of micro-semiconductor chips 14 in a display transferring structure according to a comparative example.

In FIG. 8, recesses 15 provided in a transfer substrate 12 are in a form that provides a space in which micro-semiconductor chips 14 are seated, and have a size greater than the micro-semiconductor chips 14 so that the micro-semiconductor chips 14 fit well into the recesses 15. When the micro-semiconductor chips 14 are aligned by a wet method using the transfer substrate 12, the micro-semiconductor chips 14 are arranged with an error to a degree in the space within the recesses 15.

In contrast, in the display transferring structure 100 according to an embodiment, the micro-semiconductor chip 140 is seated in the second trap 152 having a size substantially the same as that of the micro-semiconductor chip 140 in the region within the recess 150, and thus, an alignment error may be reduced.

Figure 9:
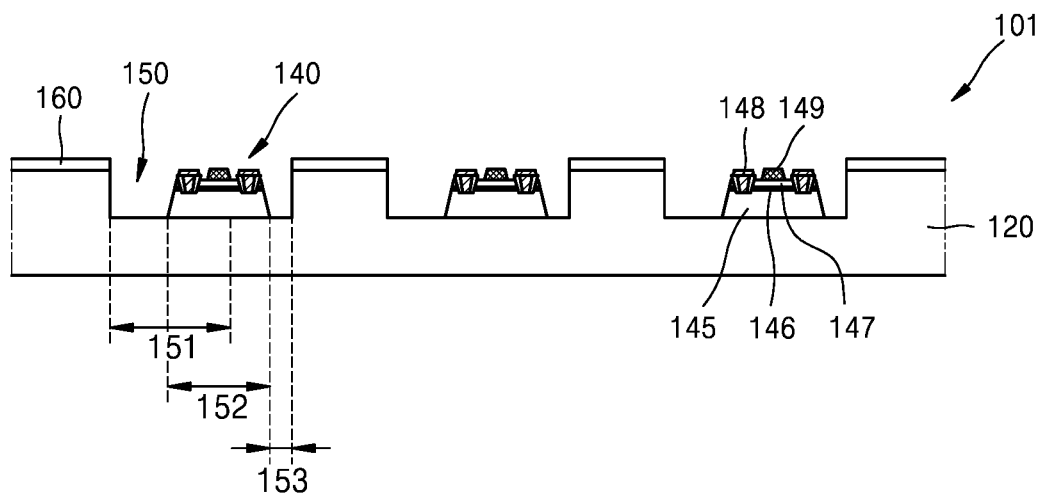
FIG. 9 is a cross-sectional view illustrating a schematic structure of a display transferring structure according to another example embodiment.

FIG. 9 is a cross-sectional view illustrating a schematic structure of a display transferring structure 101 according to another example embodiment.

The display transferring structure 101 of the example embodiment of FIG. 9 differs from the display transferring structure 100 of FIG. 1 in that a metal layer 160 is provided on an outer surface of the transfer substrate 120, and the other components are substantially the same.

The metal layer 160 may include Ag, Au, Pt, Ni, Cr, and/or Al, and may have surface energy different from that of the transfer substrate 120. Polymer may be coupled to the metal layer 160. Such a difference in surface energy not only allows the micro-semiconductor chip to be properly transferred to the recess 150, but also allows a micro-semiconductor chip remaining without being transferred to the recess 150 to be easily separated from the transfer substrate 120 in a cleaning operation. Materials of the metal layer 160 and the transfer substrate 120 may be selected so that the metal layer 160 has hydrophobicity and the recess 150 has hydrophilicity to have a large difference in surface energy.

The display transferring structures 100 and 101 described above may be applied as a display device utilizing the micro-semiconductor chip 140. The plurality of micro-semiconductor chips 140 provided in the display transferring structures 100 and 101 described above may include a plurality of LED chips that emit red light (R), green light (G), and blue light (B), or may include only a plurality of LED chips that emit blue light (B). The display transferring structures 100 and 101 may be applied to a display device in which the micro-semiconductor chips 140 operate as individual pixels, for example, an RGB self-luminous micro LED TV. In this case, the display transferring structures 100 and 101 may be utilized as a display device as a whole, or the micro-semiconductor chips 140 provided in the display transferring structures 100 and 101 may be transferred to be bonded (eutectic bonding) to a thin film transistor (TFT) substrate.

Figure 10:
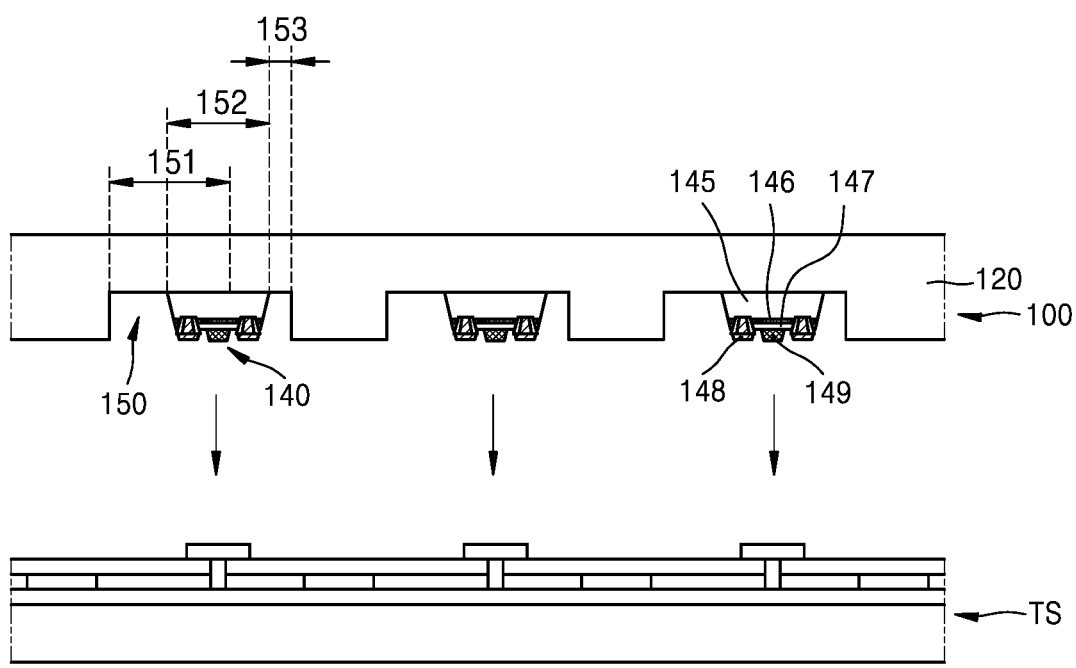
FIG. 10 shows transfer of a micro-semiconductor chip provided in a display transferring structure according to an example embodiment to a TFT substrate.

FIG. 10 shows transfer of the micro-semiconductor chip 140 provided in the display transferring structure 100 according to an example embodiment to a TFT substrate TS.

As shown, the display transferring structure 100 may serve as a transfer mold transferring the micro-semiconductor chip 140 to another location. The micro-semiconductor chip 140 may be bonded and transferred onto the TFT substrate TS including a driving circuit such as a TFT for driving the micro-semiconductor chip 140. Because the micro-semiconductor chip 140 is aligned on the second trap 152 in a determined position in the recess 150 of the transfer substrate 120, the micro-semiconductor chip 140 may be properly transferred to a determined position on the TFT substrate TS. After the micro-semiconductor chip 140 is bonded and transferred onto the TFT substrate TS, the display device may be completed through an additional process. By utilizing the display transferring structure 100 according to an embodiment, the manufacturing yield of the display device may be improved.

Figure 11:
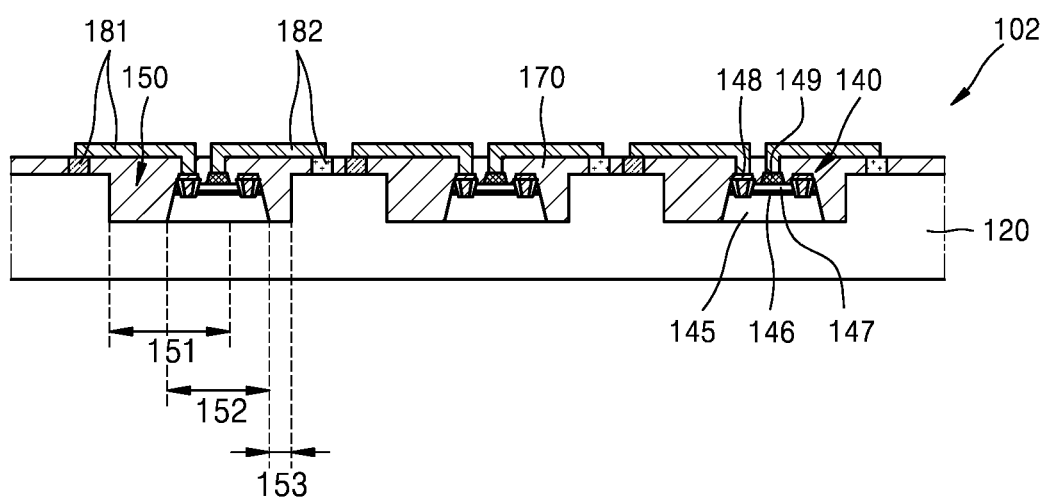
FIG. 11 is a cross-sectional view illustrating a schematic structure of a display transferring structure according to another example embodiment.
Figure 12:
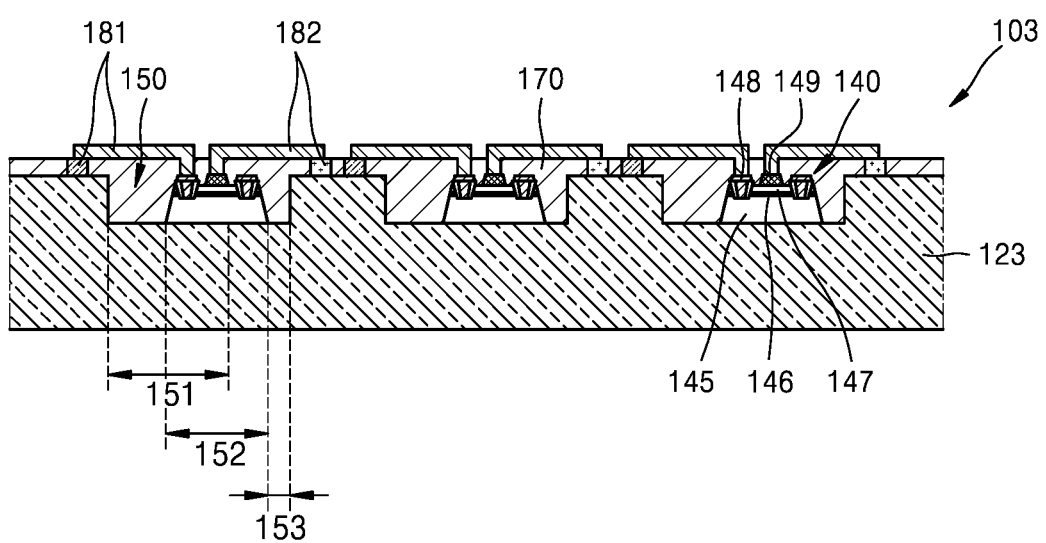
FIG. 12 is a cross-sectional view illustrating a schematic structure of a display transferring structure according to another example embodiment.
Figure 13:
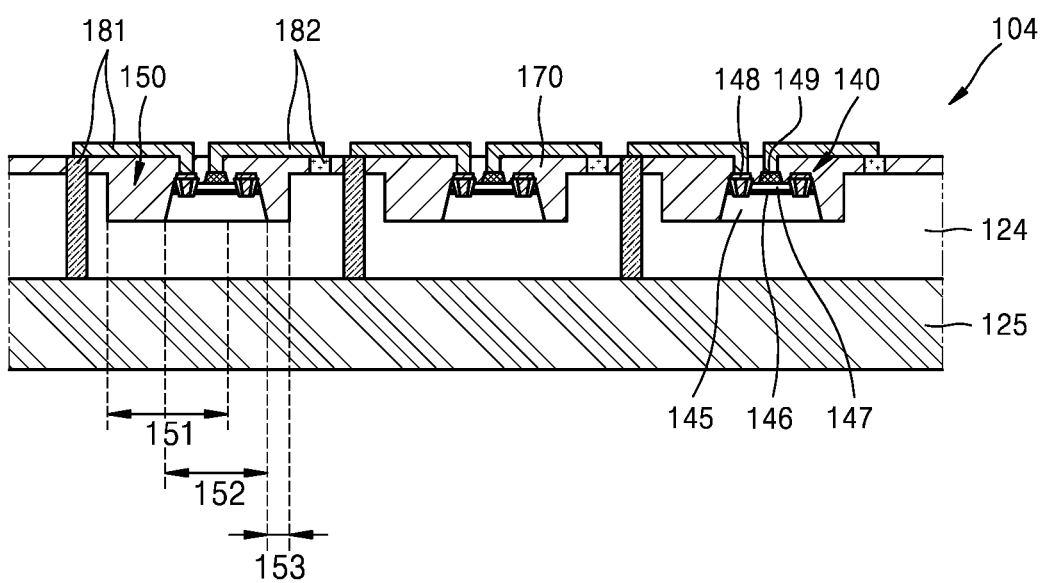
FIG. 13 is a cross-sectional view illustrating a schematic structure of a display transferring structure according to another example embodiment.

The display transferring structure 100 may be directly applied as a display device. FIGS. 11 to 13 illustrate a display transferring structure including an additional structure so that the display transferring structure may be directly applied to a display device.

FIG. 11 is a cross-sectional view illustrating a schematic structure of a display transferring structure 102 according to another example embodiment.

The display transferring structure 102 of the example embodiment of FIG. 11 has a form in which an additional material layer is further provided in the display transferring structure 100 of FIG. 1.

The display transferring structure 102 may further include an insulating layer 170 formed in the recess 150 and circuit elements 181 and 182 connected to a first electrode 148 and a second electrode 149 of the micro-semiconductor chip 140. The circuit elements 181 and 182 may form a part of the driving circuit that drives the micro-semiconductor chip 140.

FIG. 12 is a cross-sectional view illustrating a schematic structure of a display transferring structure 103 according to another example embodiment.

The display transferring structure 103 of the example embodiment of FIG. 12 differs from the display transferring structure 102 described above in that a circuit board 123 having a driving circuit for driving the micro-semiconductor chip 140 is used as a transfer substrate. The circuit board 123 may include circuit elements including a driving transistor, a switch transistor, and a capacitor. After a recess 150 having a first trap 151, a second trap 152, and a third trap 153 for aligning the micro-semiconductor chip 140 in a correct position is directly formed in the circuit board 123, the micro-semiconductor chip 140 is aligned in the second trap 152 in a wet alignment method. Therefore, an additional process is minimized, and the display transferring structure 103 may be used as a display device.

FIG. 13 is a cross-sectional view illustrating a schematic structure of a display transferring structure 104 according to another example embodiment.

The display transferring structure 104 of the example embodiment of FIG. 13 includes a circuit board 125 under a transfer substrate 124. The circuit board 125 may include circuit elements including a driving transistor, a switch transistor, and a capacitor, and the circuit elements of the circuit board 125 may be electrically connected to the micro-semiconductor chip 140 through a conductive via 190 penetrating the transfer substrate 124.

Figure 14:
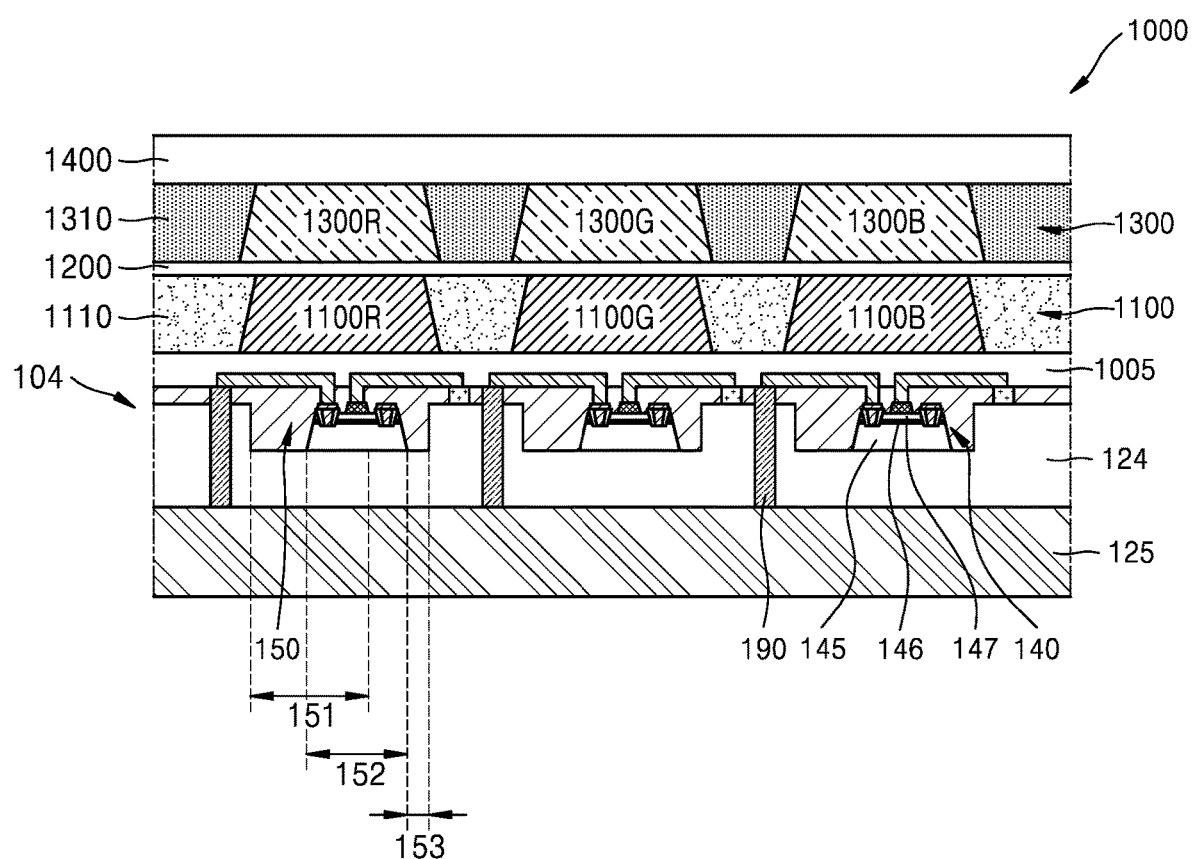
FIG. 14 is a cross-sectional view illustrating a schematic structure of a display device according to an example embodiment.

FIG. 14 is a cross-sectional view illustrating a schematic structure of a display device 1000 according to an example embodiment.

The display device 1000 includes a display transferring structure 104 in which a plurality of micro-semiconductor chips 140 are positioned in the second traps 152 of a plurality of recesses 150, respectively, and a color conversion layer 1100 positioned on the display transferring structure 104.

The display transferring structure 104 of FIG. 13 is illustrated, and without being limited thereto, the display transferring structure 104 may be altered to the display transferring structure 102 of FIG. 11, the display transferring structure 103 of FIG. 12, or a modification thereof.

A passivation layer 1005 including an insulating material may be positioned on the display transferring structure 104, and the color conversion layer 1100 may be positioned on the passivation layer 1005.

The color conversion layer 1100 may include a first color conversion layer 1100B converting light from the micro-semiconductor chip 140 into first color light, a second color conversion layer 1100G converting light into second color light, and a third color conversion layer 1100R converting light into third color light. The first color light may be, for example, blue light, the second color light may be, for example, green light, and the third color light may be, for example, red light. The first color conversion layer 1100B, the second color conversion layer 1100G, and the third color conversion layer 1100R are apart from each other with a partition wall 1110 therebetween, and face the micro-semiconductor chips 140, respectively.

When the micro-semiconductor chip 140 emits blue light, the first color conversion layer 1100B may include a resin via which blue light transmits. The second color conversion layer 1100G may convert blue light emitted from the micro-semiconductor chip 140 into green light to emit green light. The second color conversion layer 1100G may include quantum dots (QDs) or phosphors that are excited by blue light emitted from the micro-semiconductor chip 140 to emit green light. The third color conversion layer 1100R may convert blue light emitted from the micro-semiconductor chip 140 into red light to emit red light. The third color conversion layer 1100R may include QDs or phosphors that are excited by blue light emitted from the micro-semiconductor chip 140 to emit red light.

The quantum dots included in the second color conversion layer 1100G and the third color conversion layer 1100R may have a core-shell structure having a core portion and a shell portion or may have a particle structure without a shell. The core-shell structure may include a single shell structure or a multi-shell structure, e.g., a double-shell structure. The quantum dots may include a group II-VI series semiconductor, a group III-V series semiconductor, a group IV-VI series semiconductor, a group IV series semiconductor, and/or graphene quantum dots. The quantum dots may include, for example, Cd, Se, Zn, S, and/or InP, and each quantum dot may have a diameter of tens of nm or less, for example, a diameter of about 10 nm or less. The quantum dots included in the second color conversion layer 1100G and the third color conversion layer 1100R may have different sizes.

A capping layer 1200 may be positioned on the color conversion layer 1100, and a color filter layer 1300 may be positioned on the capping layer 1200. The color filter layer 1300 includes a first filter 1300B, a second filter 1300G, and a third filter 1300R apart from each other with a black matrix 1310 therebetween. The first filter 1300B, the second filter 1300G, and the third filter 1300R are arranged to face the first color conversion layer 1100B, the second color conversion layer 1100G, and the third color conversion layer 1100R, respectively. The first filter 1300B, the second filter 1300G, and the third filter 1300R allow blue light, green light, and red light to be transmitted therethrough, respectively, and absorb light of other colors. The color filter layer 1300 may be omitted. When the color filter layer 1300 is provided, light emitted without color conversion in the second color conversion layer 1100G, i.e., light other than green light, or light emitted without color conversion in the third color conversion layer 1100R, i.e., light other than red light, may be filtered by the second filter 1300G and the third filter 1300R, respectively, and thus, color purity may be increased.

A protective substrate 1400 including a transparent material may be positioned on the color conversion layer 1100.

Figure 15:
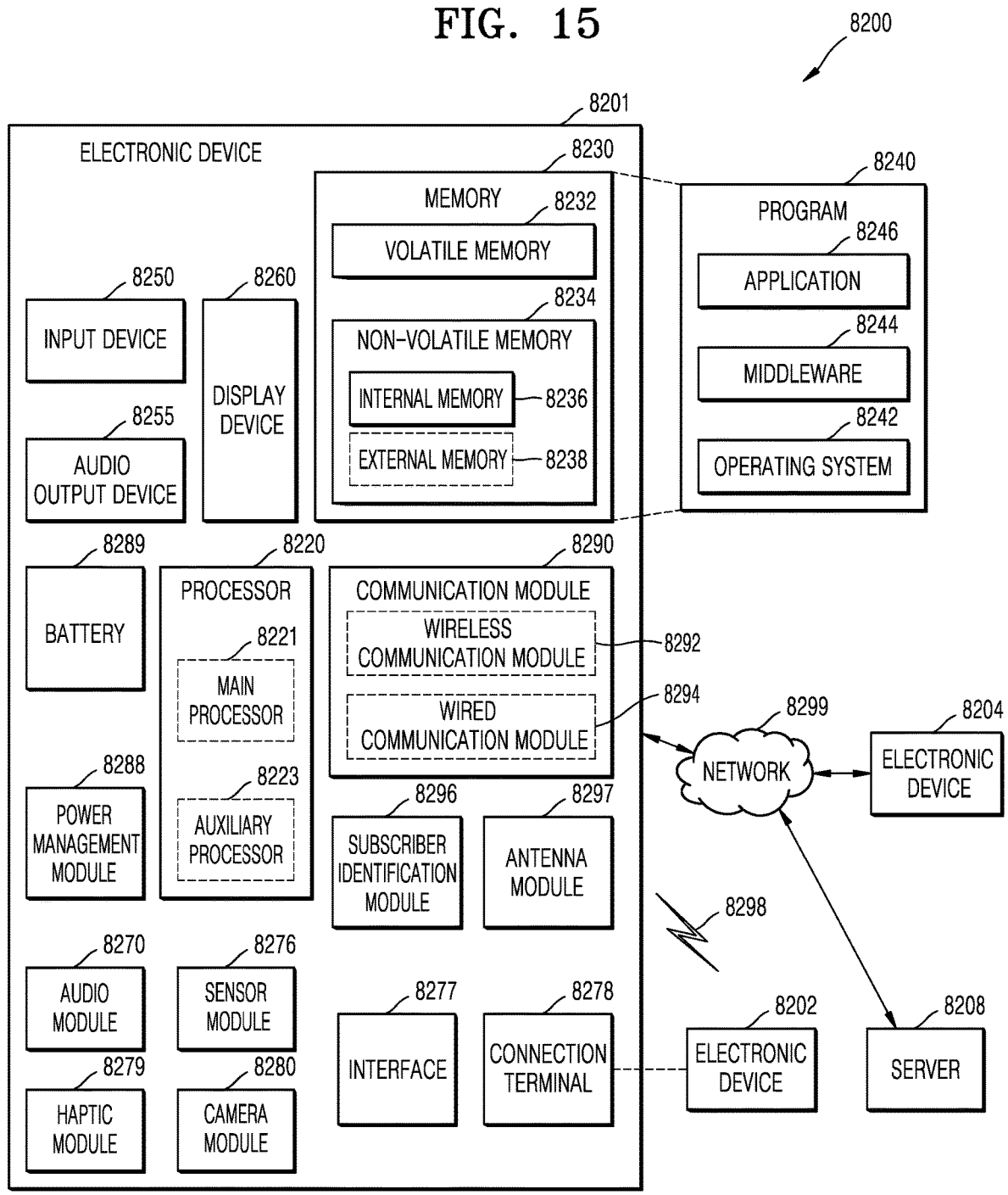
FIG. 15 is a schematic block diagram of an electronic device according to an example embodiment.

FIG. 15 is a schematic block diagram of an electronic device 8201 according to an embodiment.

Referring to FIG. 15, the electronic device 8201 may be provided in a network environment 8200. In the network environment 8200, the electronic device 8201 may communicate with another electronic device 8202 through a first network 8298 (a short-range wireless communication network, etc.), or may communicate with another electronic device 8204 and/or a server 8208 through a second network 8299 (a long-range wireless communication network, etc.). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of these components of the electronic device 8201 may be omitted or other components may be added to the electronic device 8201. Some of these components may be implemented as one integrated circuit. For example, the sensor module 8276 (a fingerprint sensor, an iris sensor, an illuminance sensor, etc.) may be included in the display device 8260 (display, etc.).

The processor 8220 may execute software (a program 8240, etc.) to control one or a plurality of other components (hardware, software components, etc.) among the electronic devices 8201 connected to the processor 8220 and perform various data processing or operations. As part of the data processing or operations, the processor 8220 may load instructions and/or data received from other components (the sensor module 8276, the communication module 8290, etc.) into a volatile memory 8232, process instructions and/or data stored in the volatile memory 8232, and store result data in a nonvolatile memory 8234. The processor 8220 may include a main processor 8221 (central processing unit, application processor, etc.) and an auxiliary processor 8223 (graphics processing unit, image signal processor, sensor hub processor, communication processor, etc.) that may be operated independently or together with the main processor 8221. The auxiliary processor 8223 may use less power than the main processor 8221 and may perform specialized functions.

The auxiliary processor 8223 may control functions and/or states related to some (the display device 8260, the sensor module 8276, the communication module 8290, etc.) of the components of the electronic device 8201 in place of the main processor 8221 while the main processor 8221 is inactive (a sleep state) or together with the main processor 8221 while the main processor 8221 is active (an application executed state). The auxiliary processor 8223 (an image signal processor, a communication processor, etc.) may be implemented as part of other functionally related components (the camera module 8280, the communication module 8290, etc.).

The memory 8230 may store various data required by the components (the processor 8220, the sensor module 8276, etc.) of the electronic device 8201. The data may include, for example, software (the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used by components (the processor 8220, etc. of the electronic device 8201) from the outside (a user, etc.) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as part of the speaker or may be implemented as an independent separate device.

The display device 8260 may visually provide information to the outside of the electronic device 8201. The display device 8260 may include a display, a hologram device, or a projector, and a control circuit for controlling a corresponding device. The display device 8260 may be the display device 1000 described above with reference to FIG. 14 or may be a display device including the display transferring structure illustrated in FIGS. 1, 9, and 11 to 13. The display device 8260 may include touch circuitry configured to detect a touch and/or a sensor circuit (a pressure sensor, etc.) configured to measure the strength of a force generated by the touch.

The audio module 8270 may convert sound into an electrical signal, or conversely, may convert an electrical signal into sound. The audio module 8270 may acquire sound through the input device 8250 and output sound through a speaker and/or a headphone of another electronic device (the electronic device 8202, etc.) connected to the audio output device 8255 and/or the electronic device 8201 directly or wirelessly.

The sensor module 8276 may detect an operating state (power, temperature, etc.) of the electronic device 8201 or an external environmental state (a user state, etc.), and generate an electrical signal and/or data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic device 8201 to be connected to another electronic device (e.g., the electronic device 8202) directly or wirelessly. The interface 8277 may include a high definition multimedia interface (HDMI), a universal serial bus (USB) interface, an SD card interface, and/or an audio interface.

A connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary cell, a rechargeable secondary cell, and/or a fuel cell.

The communication module 8290 may establish a direct (wired) communication channel and/or a wireless communication channel between the electronic device 8201 and other electronic devices (the electronic device 8202, the electronic device 8204, the server 8208, etc.) and support communication through the established communication channel. The communication module 8290 may include one or more communication processors operating independently of the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, etc.) and/or a wired communication module 8294 (a local area network (LAN) communication module, a power line communication module, etc.). Among these communication modules, a corresponding communication module may communicate with another electronic device through the first network 8298 (a short-range communication network such as Bluetooth, WiFi Direct, or infrared Data Association (IrDA) or the second network 8299 (a telecommunication network such as a cellular network, the Internet, or a computer network (LAN), WAN, etc.). These various types of communication modules may be integrated into one component (a single chip, etc.) or may be implemented as a plurality of components (multiple chips) separate from each other. The wireless communication module 8292 may verify and authenticate the electronic device 8201 in the communication network such as the first network 8298 and/or the second network 8299 using subscriber information (an international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator including a conductive pattern formed on a board (a printed circuit board (PCB), etc.). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. Signals and/or power may be transmitted or received between the communication module 8290 and other electronic devices through the selected antenna. A component (an RFIC, etc.) other than the antenna may be included as part of the antenna module 8297.

Some of the components may be connected to each other through communication methods (a bus, a general purpose input and output (BPIO), a serial peripheral interface (SPI), a mobile industry processor interface (MIPI)) and exchange signals (commands, data, etc.) with each other.

The command or data may be transmitted or received between the electronic device 8201 and the electronic device 8204 through the server 8208 connected to the second network 8299. The other electronic devices 8202 and 8204 may be the same or different types of devices as the electronic device 8201. All or some of the operations executed by the electronic device 8201 may be executed by one or more of the other electronic devices 8202, 8204, and 8208. For example, when the electronic device 8201 needs to perform a function or service, the electronic device 8201 may request one or more other electronic devices to perform a portion or the entirety of the function or the service, instead of executing the function or service by itself. Upon receiving the request, one or more other electronic devices may execute an additional function or service related to the request, and transmit a result of the execution to the electronic device 8201. To this end, cloud computing, distributed computing, and/or client-server computing technology may be used.

In addition, the display device according to an embodiment may also be applied to a variety of products such as mobile devices, automobiles, head-up displays, augmented/virtual reality devices, large signage, wearable displays, rollable TVs, stretchable displays, etc.

The display transferring structure described above includes a plurality of recesses having a shape that facilitates self-alignment of micro-semiconductor chips, so that a plurality of micro-semiconductor chips may be properly aligned in correct positions within a large area.

Various types of display devices, such as a large display device, may be easily implemented using the display transferring structure described above.

It should be understood that example embodiments described herein should be considered in a descriptive sense only and not for purposes of limitation. Descriptions of features or aspects within each embodiment should typically be considered as available for other similar features or aspects in other example embodiments. While one or more embodiments have been described with reference to the figures, it will be understood by those of ordinary skill in the art that various changes in form and details may be made therein without departing from the spirit and scope as defined by the following claims.

What is claimed is:

1. A display transferring structure comprising:
   a transfer substrate including a plurality of recesses, each of the plurality of recesses comprising a first trap having a space in which an object is movable and a second trap connected to the first trap and having a shape and size in which the object is seatable; and
   a micro-semiconductor chip positioned in the second trap,
   wherein each of the plurality of recesses further comprises a plurality of third traps connected to the first trap or the second trap.

2. The display transferring structure of claim 1,
   wherein a size of the first trap is such that two or more micro-semiconductor chips cannot fit into each of the plurality of recesses.

3. The display transferring structure of claim 1,
   wherein a width of the second trap is 105% or less of a width of the micro-semiconductor chip.

4. The display transferring structure of claim 1,
   wherein the second trap overlaps the first trap by a certain length.

5. The display transferring structure of claim 4,
   wherein the second trap is circular, and a certain length by which the second trap overlaps the first trap is greater than a radius of the second trap.

6. The display transferring structure of claim 4,
   wherein each of the third traps has a size smaller than the second trap.

7. The display transferring structure of claim 6,
   wherein the first trap, the second trap, and at least one of the third traps have a shape with symmetry, and the first trap, the second trap, and the at least one of third traps are arranged such that centers of the symmetry thereof lie on a straight line.

8. The display transferring structure of claim 6,
   wherein each of the plurality of third traps has a circular shape.

9. The display transferring structure of claim 1,
   wherein an outer surface of the transfer substrate and an inner surface of each of the plurality of recesses are surface-treated to have different properties.

10. The display transferring structure of claim 1,
    wherein a metal coating layer is formed on an outer surface of the transfer substrate.

11. The display transferring structure of claim 1, further comprising a driving circuit configured to drive the micro-semiconductor chip.

12. The display transferring structure of claim 11,
    wherein the driving circuit is located in the transfer substrate.

13. The display transferring structure of claim 11, further comprising a circuit board located under the transfer substrate and including the driving circuit.

14. A display device comprising:
    a transfer substrate including a plurality of recesses, each of the plurality of recesses comprising a first trap having a space in which an object is movable and a second trap connected to the first trap and having a shape and size in which the object is seatable;
    a micro-semiconductor chip positioned in the second trap;
    a driving circuit configured to drive the micro-semiconductor chip; and
    a color conversion layer positioned on the transfer substrate,
    wherein each of the plurality of recesses further comprises a plurality of third traps connected to the first trap or the second trap.

15. The display device of claim 14,
    wherein the driving circuit is located in the transfer substrate.

16. The display device of claim 14, further comprising a circuit board located under the transfer substrate and including the driving circuit.

17. The display device of claim 14,
    wherein a size of the first trap is such that two or more micro-semiconductor chips cannot fit into each of the plurality of recesses.

18. The display device of claim 14,
    wherein a width of the second trap is 105% or less of a width of the micro-semiconductor chip.

19. The display device of claim 14,
    wherein the second trap overlaps the first trap by a certain length.

20. The display device of claim 19,
    wherein the first trap and the second trap are circular, and the certain length by which the second trap overlaps the first trap is greater than a radius of the second trap.

21. The display device of claim 14,
    wherein each of the third traps has a size smaller than the second trap.

22. The display device of claim 21,
    wherein the first trap, the second trap, and at least one of the third traps have a shape with symmetry, and the first trap, the second trap, and the at least one of third traps are arranged such that centers of the symmetry thereof lie on a straight line.

23. An electronic device comprising the display device of claim 14.

24. The display transferring structure of claim 1, wherein, in each of the plurality of recesses, one of the plurality of third traps is connected to the first trap.

* * * * *